(12) United States Patent
Hsu et al.

(10) Patent No.: US 8,143,131 B2
(45) Date of Patent: Mar. 27, 2012

(54) METHOD OF FABRICATING SPACERS IN A STRAINED SEMICONDUCTOR DEVICE

(75) Inventors: Chen-Pin Hsu, Taoyuan (TW); Kong-Beng Thei, Hsin-Chu County (TW); Harry Chuang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 176 days.

(21) Appl. No.: 12/415,021

(22) Filed: Mar. 31, 2009

(65) Prior Publication Data
US 2010/0244153 A1    Sep. 30, 2010

(51) Int. Cl.
H01L 29/78  (2006.01)
H01L 21/336 (2006.01)

(52) U.S. Cl. ........ 438/303; 257/408; 257/E21.435; 257/E21.409; 257/E29.266; 438/299

(58) Field of Classification Search .......... 438/299, 438/303; 257/408
See application file for complete search history.

(56) References Cited

U.S. PATENT DOCUMENTS

| | | | |
|---|---|---|---|
| 6,432,773 B1 | 8/2002 | Gerber et al. | |
| 6,555,865 B2 | 4/2003 | Lee et al. | |
| 6,764,911 B2 * | 7/2004 | Hsu et al. | 438/303 |
| 6,949,436 B2 * | 9/2005 | Buller et al. | 438/303 |
| 7,064,071 B2 * | 6/2006 | Schwan | 438/696 |
| 7,091,098 B2 | 8/2006 | Chen et al. | |
| 7,129,127 B2 * | 10/2006 | Chidambaram et al. | 438/231 |
| 7,173,296 B2 * | 2/2007 | Bu et al. | 257/288 |
| 7,226,831 B1 * | 6/2007 | Metz et al. | 438/216 |
| 2004/0175911 A1 * | 9/2004 | Mehrad et al. | 438/595 |
| 2005/0040479 A1 * | 2/2005 | Koldiaev et al. | 257/411 |
| 2005/0112817 A1 * | 5/2005 | Cheng et al. | 438/219 |
| 2005/0287751 A1 * | 12/2005 | Mehrad et al. | 438/303 |
| 2007/0020864 A1 * | 1/2007 | Chong et al. | 438/300 |
| 2007/0077716 A1 * | 4/2007 | Chen et al. | 438/300 |
| 2007/0269952 A1 * | 11/2007 | Chong et al. | 438/301 |
| 2007/0298557 A1 * | 12/2007 | Nieh et al. | 438/197 |
| 2007/0298565 A1 * | 12/2007 | Nieh et al. | 438/222 |

* cited by examiner

*Primary Examiner* — Fernando L Toledo
*Assistant Examiner* — Robert Carpenter
(74) *Attorney, Agent, or Firm* — Haynes and Boone, LLP

(57) ABSTRACT

The present disclosure provides a method for fabricating a semiconductor device that includes forming a gate stack over a silicon substrate, forming dummy spacers on sidewalls of the gate stack, isotropically etching the silicon substrate to form recess regions on either side of the gate stack, forming a semiconductor material in the recess regions, the semiconductor material being different from the silicon substrate, removing the dummy spacers, forming spacer layers having an oxide-nitride-oxide configuration over the gate stack and the semiconductor material, and etching the spacer layers to form gate spacers on the sidewalls of the gate stack.

20 Claims, 11 Drawing Sheets

METHOD OF FABRICATING SPACERS IN A STRAINED SEMICONDUCTOR DEVICE

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

In a semiconductor fabrication process, spacers may be formed on the sidewalls of a gate stack. The spacers may be formed by methods including deposition of suitable spacer material and etching the material to form a desired spacer profile. However, traditional methods of forming the spacers may leave an undesired residue of spacer material.

SUMMARY

One of the broader forms of an embodiment of the present invention involves a method of fabricating a semiconductor device. The method includes providing a silicon substrate having a shallow trench isolation (STI) formed thereon; forming a gate stack over the silicon substrate; forming dummy spacers on sidewalls of the gate stack; forming a recess region in the silicon substrate, wherein the recess region is interposed between the gate stack and the shallow trench isolation; epi-growing a semiconductor material in the recess region, wherein the semiconductor material is different from the silicon substrate; removing the dummy spacers; forming a first silicon oxide layer over the gate stack and the semiconductor material; forming a silicon nitride layer over the first silicon oxide layer; forming a second silicon oxide layer over the silicon nitride layer; performing a first dry etching process to remove a portion of the second silicon oxide layer; performing a second dry etching process to remove a portion of the silicon nitride layer; and performing a third dry etching process to remove a portion of the first silicon oxide layer thereby forming gate spacers on the sidewalls of the gate stack, wherein each gate spacer includes a remaining portion of the first silicon oxide layer, the silicon nitride layer, and the second silicon oxide layer.

Another one of the broader forms of an embodiment of the present invention involves a method of fabricating a semiconductor device. The method includes forming a gate stack over a silicon substrate; forming dummy spacers on sidewalls of the gate stack; isotropically etching the silicon substrate to form recess regions on either side of the gate stack; forming a semiconductor material in the recess regions, wherein the semiconductor material is different from the silicon substrate; removing the dummy spacers; forming a plurality of spacer layers having an oxide-nitride-oxide configuration over the gate stack and the semiconductor material; and etching the spacer layers to form gate spacers on the sidewalls of the gate stack.

Yet another one of the broader forms of an embodiment of the present invention involves a semiconductor device. The semiconductor device includes a silicon substrate having a silicon region, strained semiconductor material regions, and a shallow trench isolation region, wherein one of the strained semiconductor material regions is interposed between the silicon region and the shallow trench isolation region, and wherein the strained semiconductor material regions include an isotropic profile; and a transistor including: a gate stack formed over the silicon region; spacers formed on sidewalls of the gate stack, wherein each spacer includes a nitride layer sandwiched between a first oxide layer and a second oxide layer; and lightly doped source/drain (LDD) regions each formed in a portion of the silicon region underneath the spacer and in a portion of the strained semiconductor material region.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
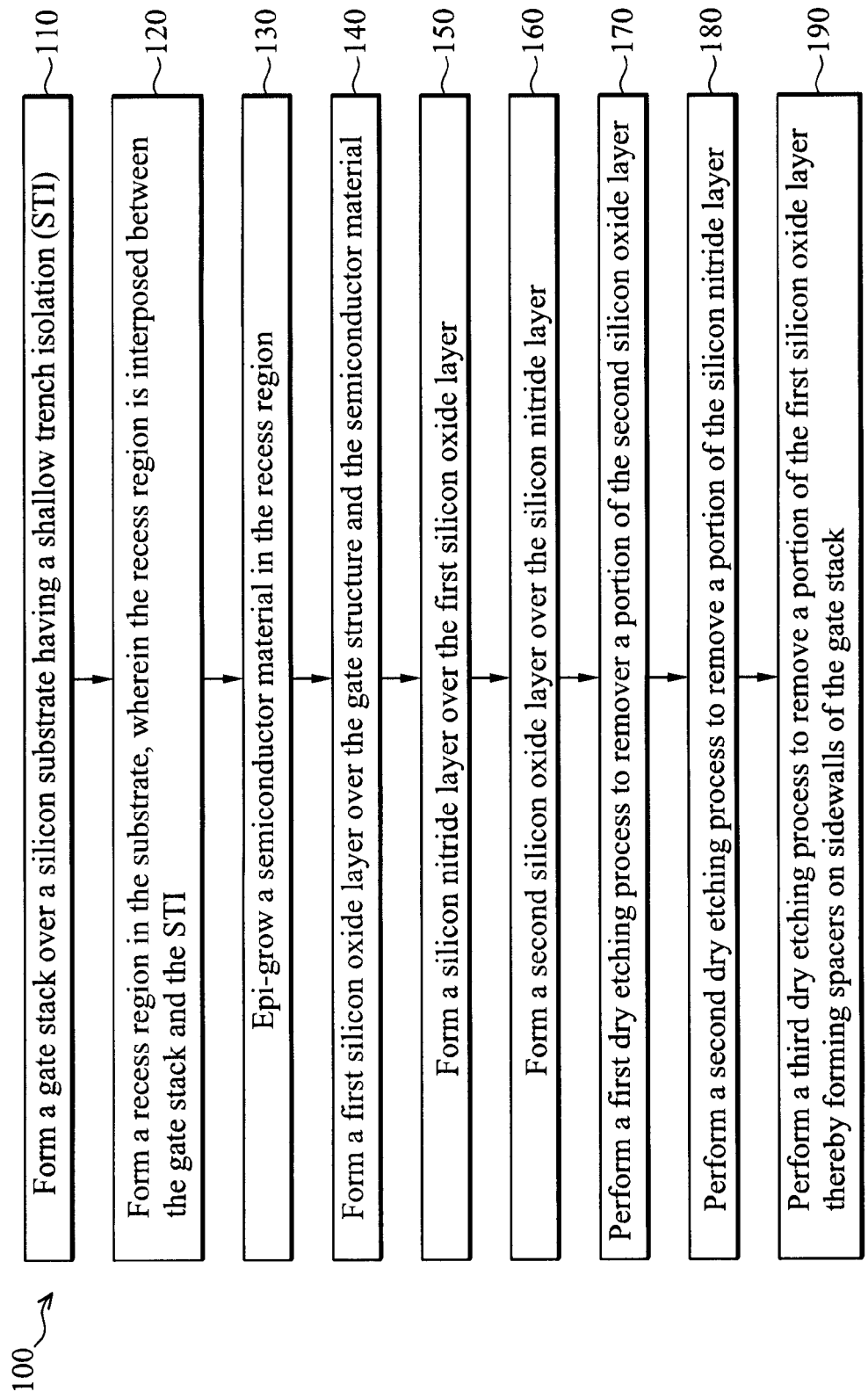
FIG. 1 is a flowchart illustrating a method for forming a spacer according to various aspects of the present disclosure.

Illustrated in FIG. 1 is a flowchart of a method 100 for forming a spacer according to various aspects of the present disclosure. FIGS. 2A-2J are cross sectional views of a semiconductor device 200 at various stages of fabrication according to the method 100 of FIG. 1. The semiconductor device 200 may be an integrated circuit, or portion thereof, that may comprise memory circuits and/or logic circuits, passive components such as resistors, capacitors, and inductors, and active components such as P-channel field effect transistors (pFET), N-channel FET (nFET), metal-oxide semiconductor field effect transistors (MOSFET), or complementary metal-oxide semiconductor (CMOS) transistors. It should be noted that some features of the semiconductor device 200 may be fabricated with a CMOS process flow. Accordingly, it is understood that additional processes may be provided before, during, and after the method 100 of FIG. 1, and that some other processes may only be briefly described herein.

Figure 2A:
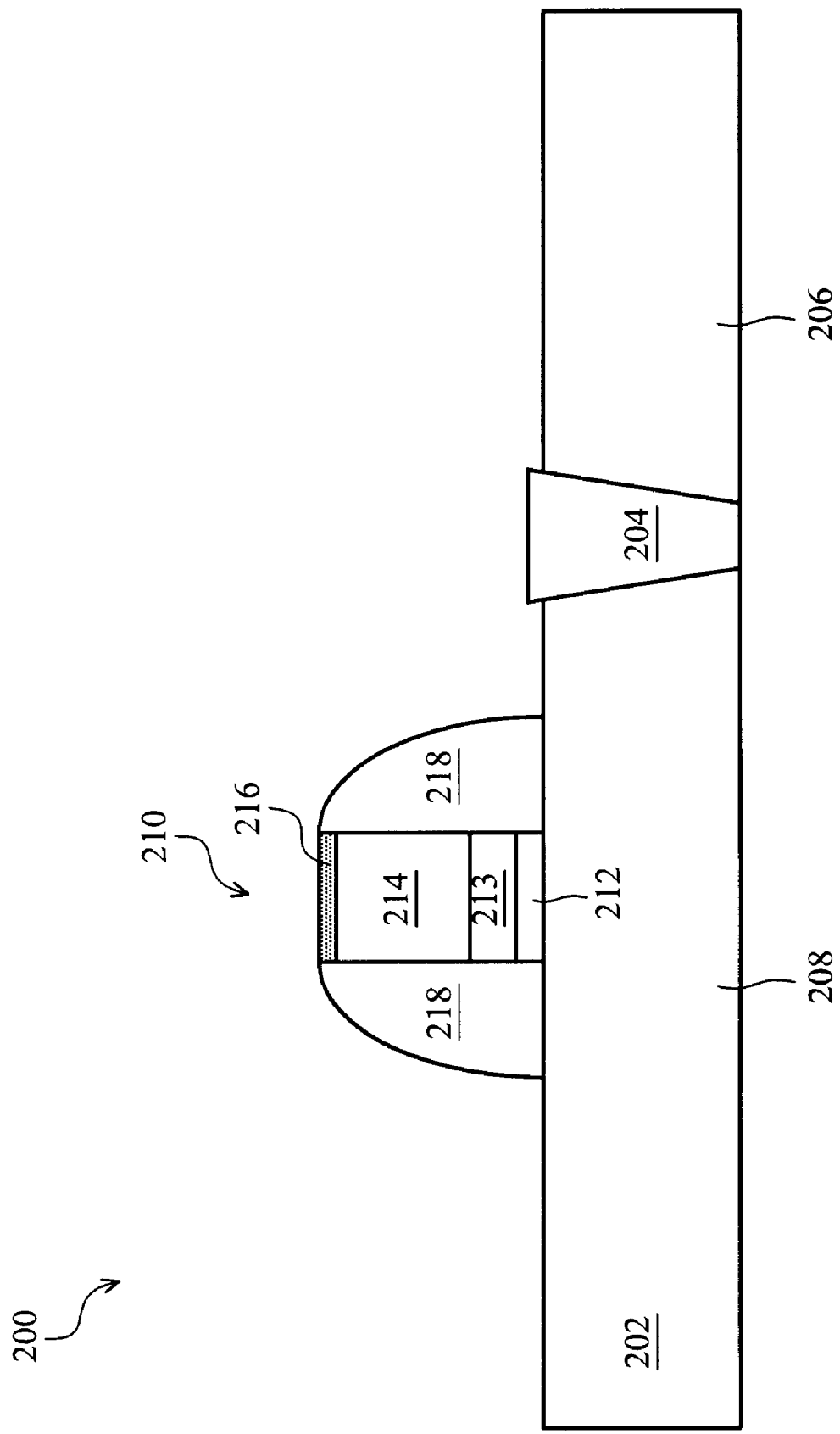
FIGS. 2A-2J are cross sectional views of a semiconductor device at various stages of fabrication according to the method of FIG. 1.

Referring to FIG. 1, the method 100 begins with block 110 in which a gate stack is formed over a silicon substrate having a shallow trench isolation. Referring now to FIG. 2A, a semiconductor device 200 at an intermediate stage of fabrication is illustrated. The semiconductor device 200 may include a substrate 202, such as a silicon substrate. The substrate 202 may include various doping configurations depending on design requirements as is known in the art. The substrate 202 may also include other elementary semiconductors such as germanium and diamond. Alternatively, the substrate 202 may include a compound semiconductor and/or an alloy semiconductor. In the present embodiment, the substrate 202 includes a silicon material.

The semiconductor device 200 may further include an isolation structure 204 such as a shallow trench isolation (STI) feature formed in the substrate 202 for isolating active regions 206 and 208 in the substrate. The isolation structure 204 may include a dielectric material and may be formed of silicon oxide, silicon nitride, silicon oxynitride, fluoride-doped silicate (FSG), and/or a low-k dielectric material known in the art. The active regions 206 and 208 may be configured for an N-type metal-oxide-semiconductor transistor device (referred to as NMOS), or a P-type metal-oxide-semiconductor transistor device (referred to as PMOS).

The semiconductor device 200 may include a gate stack 210 formed over the active region 208. The gate stack 210 may include an interfacial layer (not shown) formed over the substrate 202. The interfacial layer may include silicon oxide ($SiO_2$) or silicon oxynitride (SiON) having a thickness of about 5 to about 10 angstrom (A). The gate stack 210 may further include a high-k dielectric layer 212 formed over the substrate 202. The high-k dielectric layer 212 may include hafnium oxide ($HfO_x$). Alternatively, the high-k dielectric layer 212 may optionally include other high-k dielectrics such as LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides, or other suitable materials. The high-k dielectric layer 212 may include a thickness ranging from about 10 to about 40 angstrom (A). The high-k dielectric layer 212 may be formed by atomic layer deposition (ALD) or other suitable technique.

The gate stack 210 may further include a metal layer 213 formed over the high-k dielectric layer 212. The metal layer 213 may include any metal material suitable for forming a metal gate or portion thereof, including work function layers, liner layers, interface layers, seed layers, adhesion layers, barrier layers, etc. For example, the metal layer may include TiN, TaN, ZrN, HfN, VN, NbN, CrN, MoN, WN, TiAl, TiAlN, or combinations thereof. The metal layer 213 may be formed by ALD, physical vapor deposition (PVD or sputtering), chemical vapor deposition (CVD), or other suitable processes. The gate stack 210 may further include an active material layer 214 formed over the metal layer 213. The active material layer 214 may be a metal layer and may include Al, Cu, W, Ti, Ta, Cr, V, Nb, Zr, Hf, Mo, Ni, Co, or combinations thereof. Alternatively, the active material layer 214 may be a polysilicon (or poly) layer. The active material layer 214 may be formed by various deposition techniques such as PVD, CVD, ALD, plating, or other suitable techniques.

The gate stack 210 may also include a hard mask layer 216 formed over the active material layer 214. The hard mask layer 216 may be used to pattern the underlying layers and may include a dielectric material such as silicon oxide, silicon nitride, silicon oxynitride, or silicon carbide. In the present embodiment, the hard mask layer 216 includes silicon nitride. Dummy spacers 218 may also be formed on either side of the gate stack 210. The dummy spacers 218 may include a dielectric material such as silicon nitride or silicon oxide. In the present embodiment, the dummy spacers 218 include silicon oxide. The dummy spacers 218 may be formed by depositing a dummy spacer layer over the gate stack 210 and the substrate 202, and then performing a dry etching process on the dummy spacer layer.

Figure 2B:
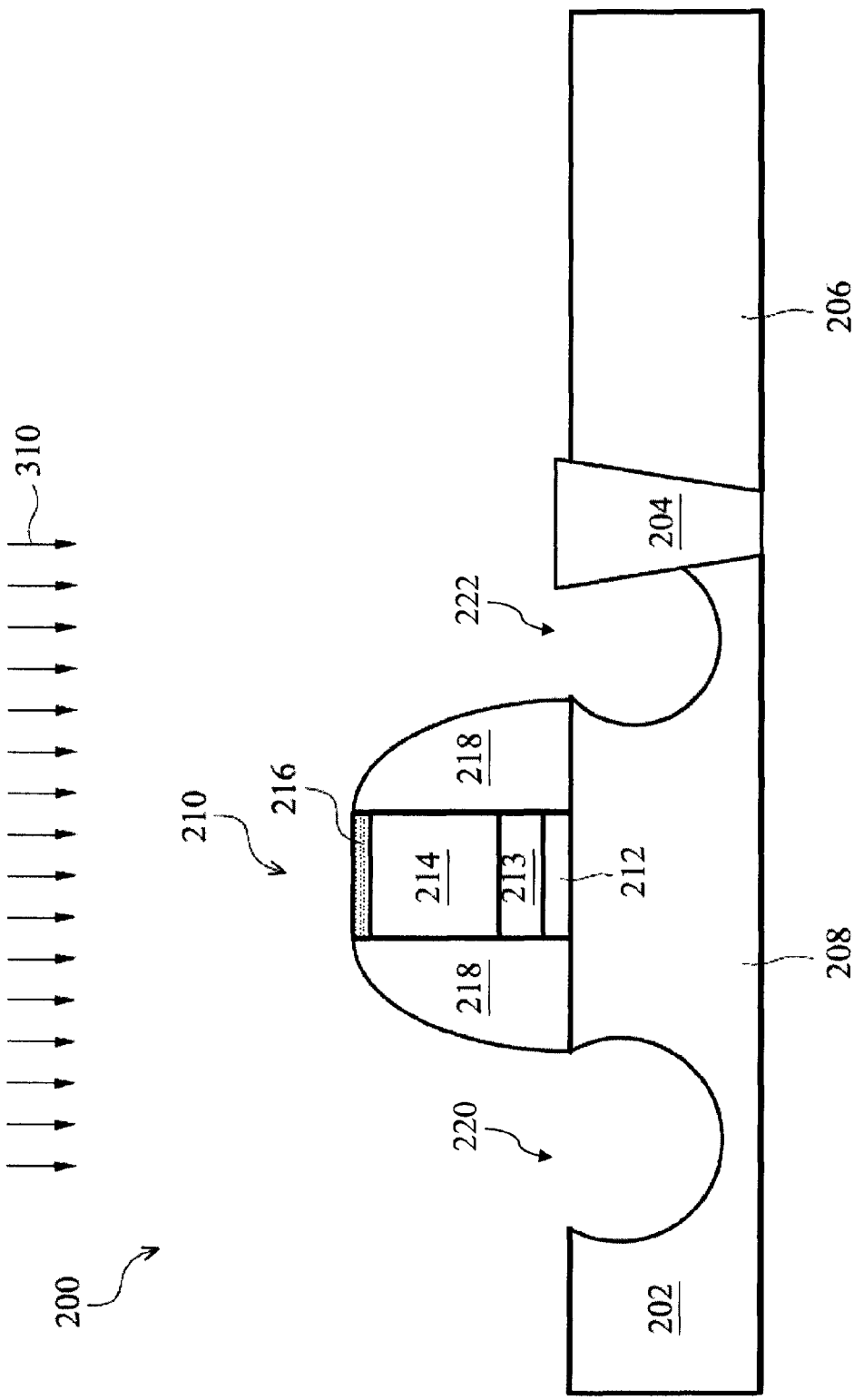

The method 100 continues with block 120 in which a recess region is formed in the substrate, wherein the recess region is interposed between the gate stack and the shallow trench isolation. Referring now to FIG. 2B, an etching process 310 may be performed to the substrate 202 to form recess regions 220 and 222. In the present embodiment, the etching process 310 may include an etching process that forms an isotropic profile. The etching process 310 may include a dry etching process using a plasma gas or a wet etching process using an acid. For example, the etching process 310 may use a HBr plasma gas as an etchant. Also in the present embodiment, the etching process 310 may tune a bias voltage for the plasma gas to achieve desired profiles for recess regions 220 and 222, including the isotropic profile shown in FIG. 2B for the present embodiment. In other embodiments, a wet etching process that includes an HF acid as an etchant may be used to form an isotropic profile for the recess regions 220 and 222. In still other embodiments, a combination dry and wet etching process may be implemented to form the isotropic profile. As mentioned above, the STI 204 may include a dielectric material, whereas the substrate 202 includes a silicon material. There may be etching selectivity between the dielectric material of the STI 204 and the silicon material of the substrate 202 such that the etching process 310 may not etch away the STI 204. Hence, when the gate stack 210 is located next to the STI 204, the etching process 310 may be stopped or interrupted by the STI 204 such that the STI 204 forms a boundary of the recess region 222. This may lead to residue removal issues when sidewall or gate spacers are subsequently formed, which will be discussed later.

Figure 2C:
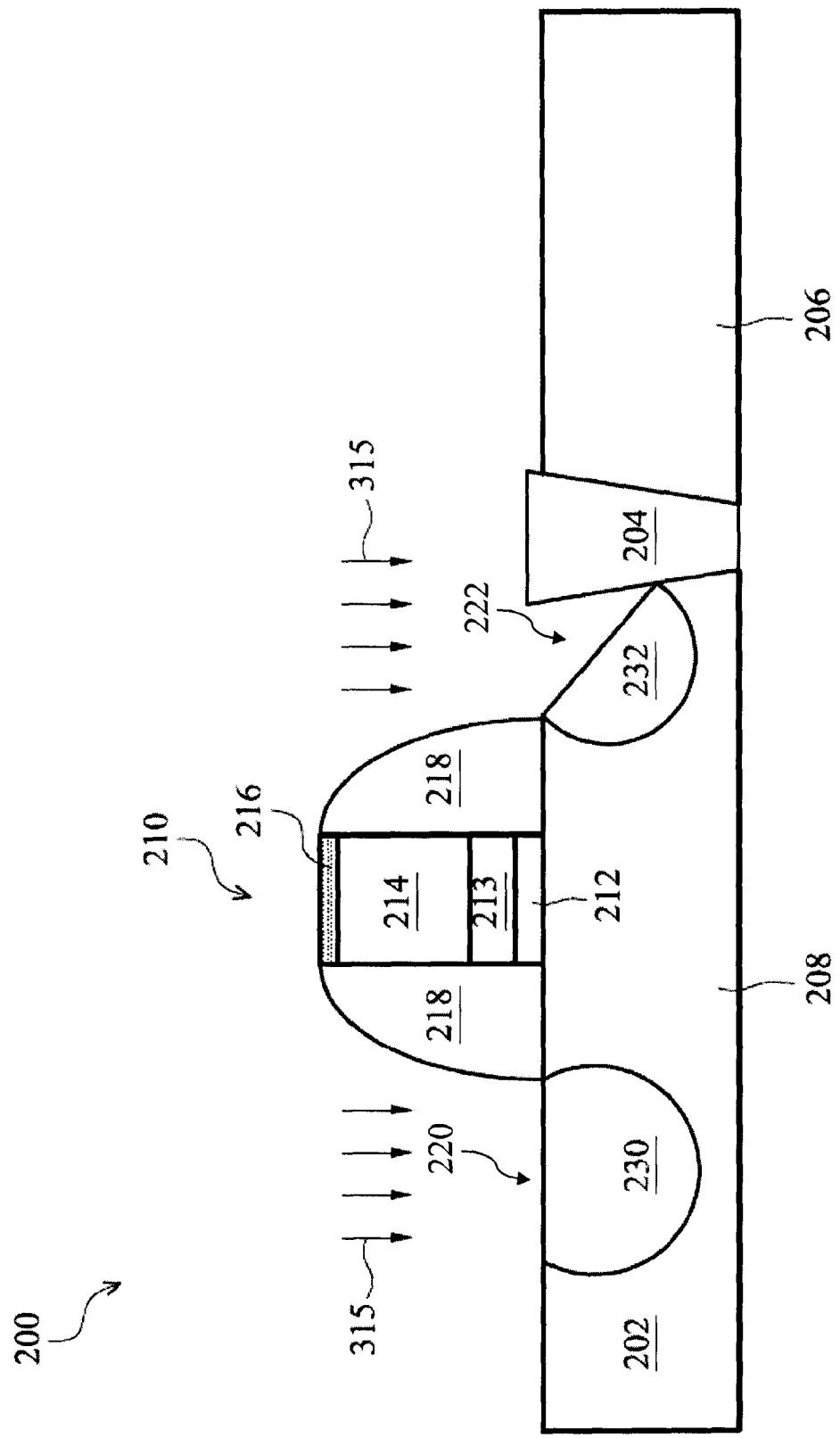

The method 100 continues with block 130 in which a semiconductor material is epi-grown in the recess region. Referring now to FIG. 2C, a semiconductor material 230 and 232 may be formed in the recess regions 220 and 222, respectively, through a selective epi-growth process (SEG) 315 or other suitable epi-technology process. The SEG process 315 may use a special CVD process. For example, the special CVD process may implement a low deposition rate or a low substrate temperature. Alternatively, ALD may be used for the SEG process 315. The semiconductor material 230 and 232 may be a material different from the silicon substrate 202. This may be done to create strain between the semiconductor material 230, 232 and the substrate 202 so that carrier mobility of the active region 208 may be enhanced, which may allow for a greater channel current without having to increase a gate voltage. Therefore, the semiconductor material 230 and 232 may be referred to as a "strained" semiconductor material, and the interface between the silicon substrate 202 and the semiconductor material 232 in the recess region 222 may be referred to as a "strained" interface. An advantage of the present embodiment is enhanced carrier mobility due to the strained feature. Additionally, the strained feature may be raised above the substrate 202. In one embodiment, the active region 208 may be a PMOS device, and the semiconductor material 230 and 232 may include silicon germanium (SiGe). In another embodiment, the active region 208 may be an NMOS device, and the semiconductor material 230 and 232 may include silicon carbide (SiC). However, it has been observed that the SEG process 315 may not be capable of growing the semiconductor material 232 on a dielectric material such as the STI 204, as the semiconductor material 232 is typically formed on a crystal surface such as the silicon substrate 202 using an SEG process 315. Consequently, the semiconductor material 232 formed in the recess region 222 may have a slanted surface, as shown in FIG. 2C.

Figure 2D:
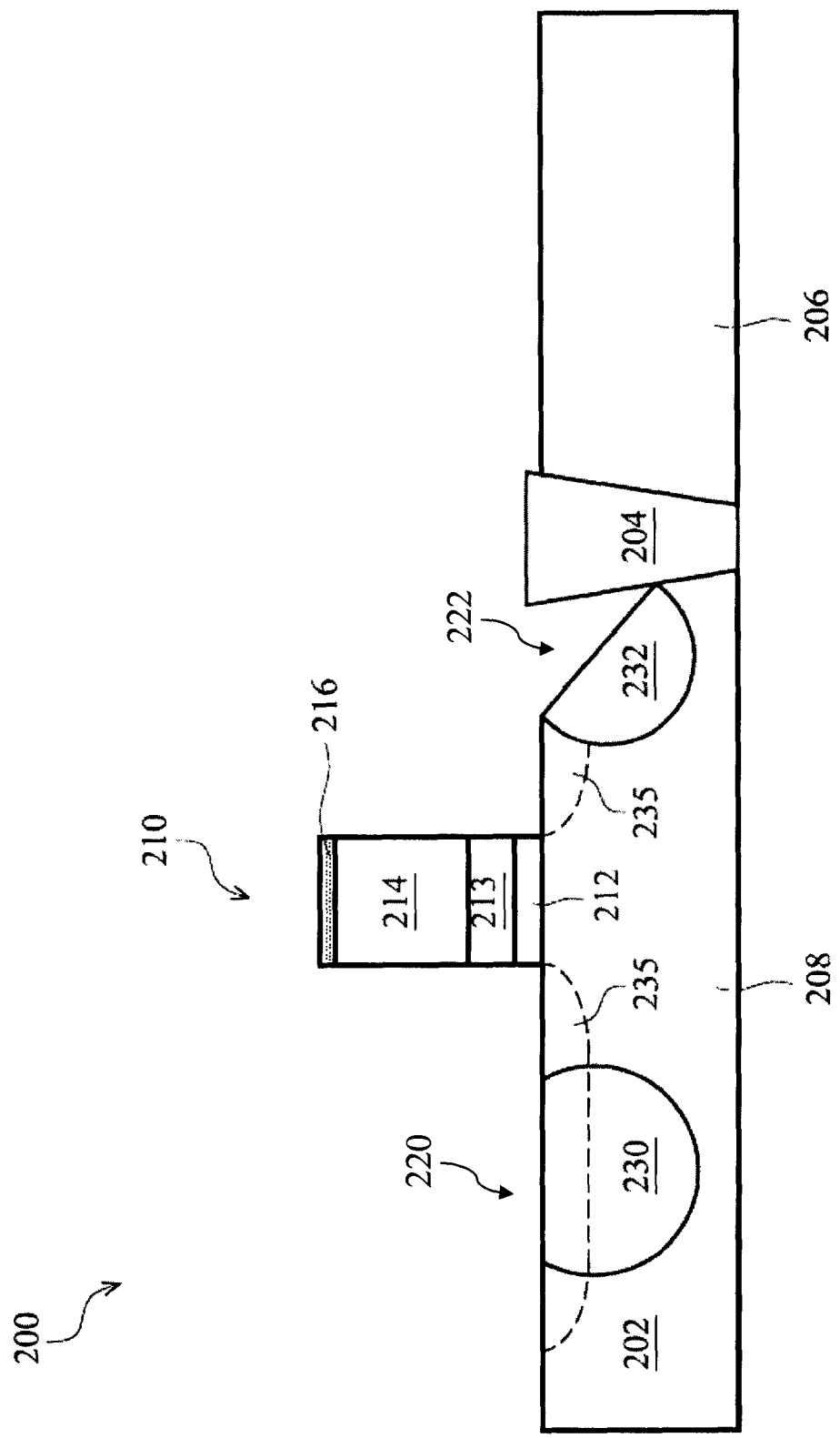

Referring now to FIG. 2D, the dummy spacers 218 may be removed by an etching process. After the dummy spacers 218 are etched away, lightly doped source/drain (referred to as LDD) regions 235 may be formed in the substrate 202 on either side of the gate stack 210 by an ion implantation or diffusion process as is known in the art. In one embodiment, the active region 208 may be a PMOS device, and P-type dopants such as boron may be implanted in the PMOS device 208. In another embodiment, the active region 208 may be an NMOS device, and N-type dopants such as phosphorus or arsenic may be implanted in the NMOS device 208. As shown in FIG. 2D, a portion of the LDD regions 235 may be formed in the silicon substrate 202, and another portion of the LDD regions 235 may be formed in the semiconductor material 230 and 232 in the recess regions 220 and 222, respectively.

Figure 2E:
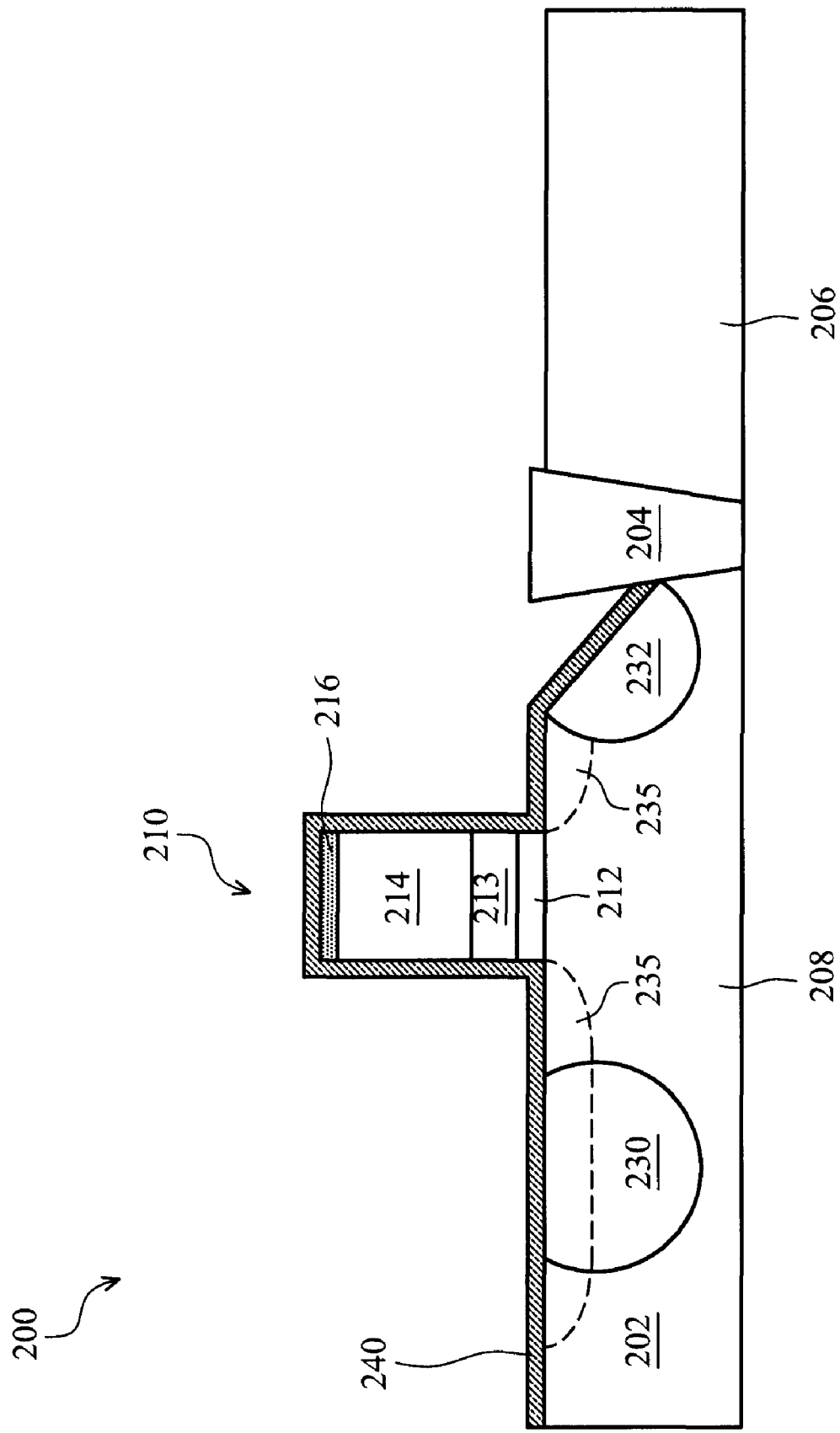

The method 100 continues with block 140 in which a first silicon oxide layer is formed over the gate stack and the semiconductor material. Referring now to FIG. 2E, a spacer layer 240 may be formed over the substrate 202 and the gate stack 210 by CVD, ALD, or other suitable technique. The spacer layer 240 may include an oxide material such as silicon oxide. The spacer layer 240 may include a thickness ranging from about 30 angstroms to about 200 angstroms.

Figure 2F:
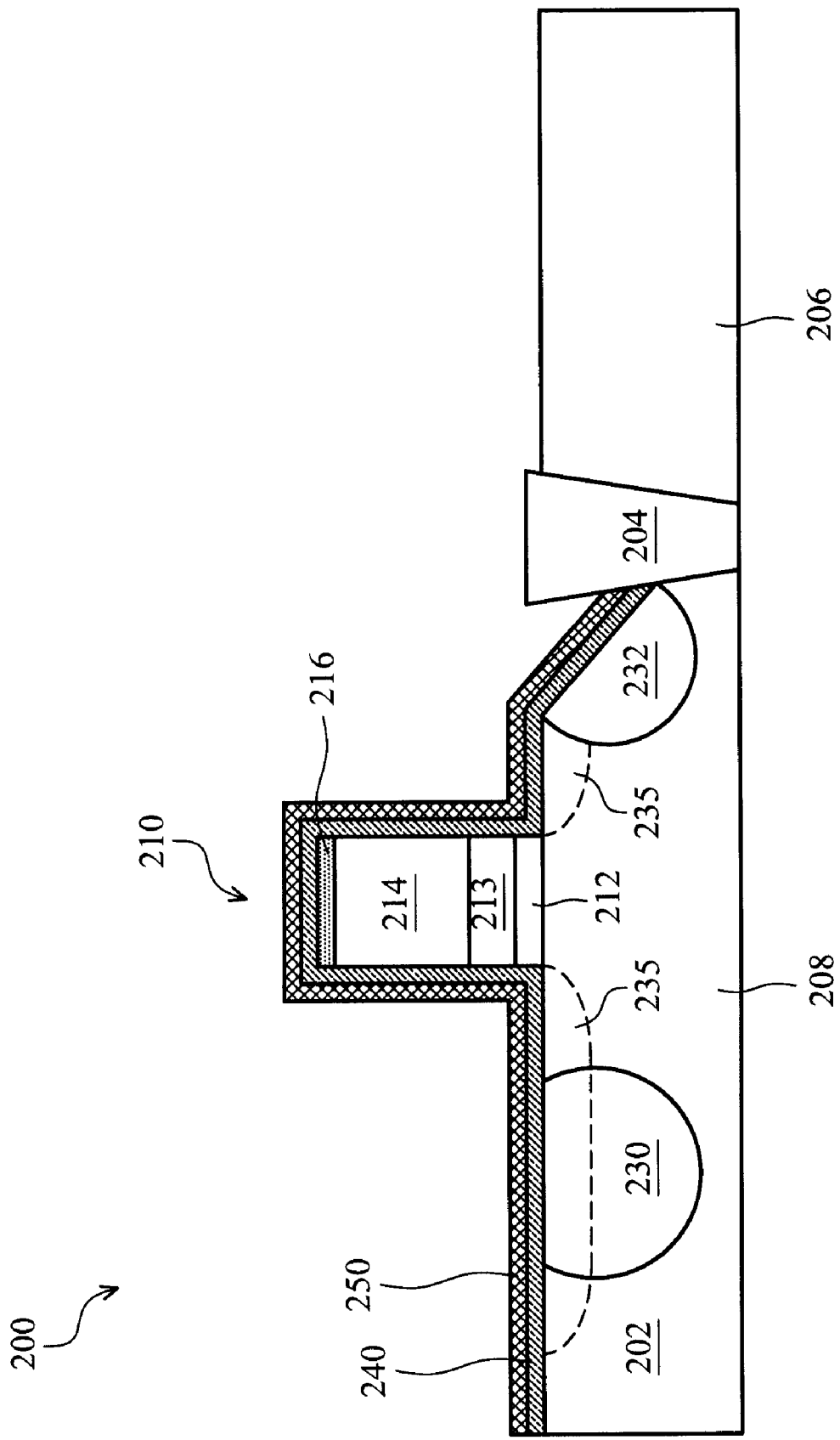

The method 100 continues with block 150 in which a silicon nitride layer is formed over the first silicon oxide spacer layer. Referring now to FIG. 2F, a spacer layer 250 may be formed over the spacer layer 240 by CVD, ALD, or other suitable technique. The spacer layer 250 may include a nitride material such as silicon nitride. The spacer layer 250 may include a thickness ranging from about 30 angstroms to about 200 angstroms.

Figure 2G:
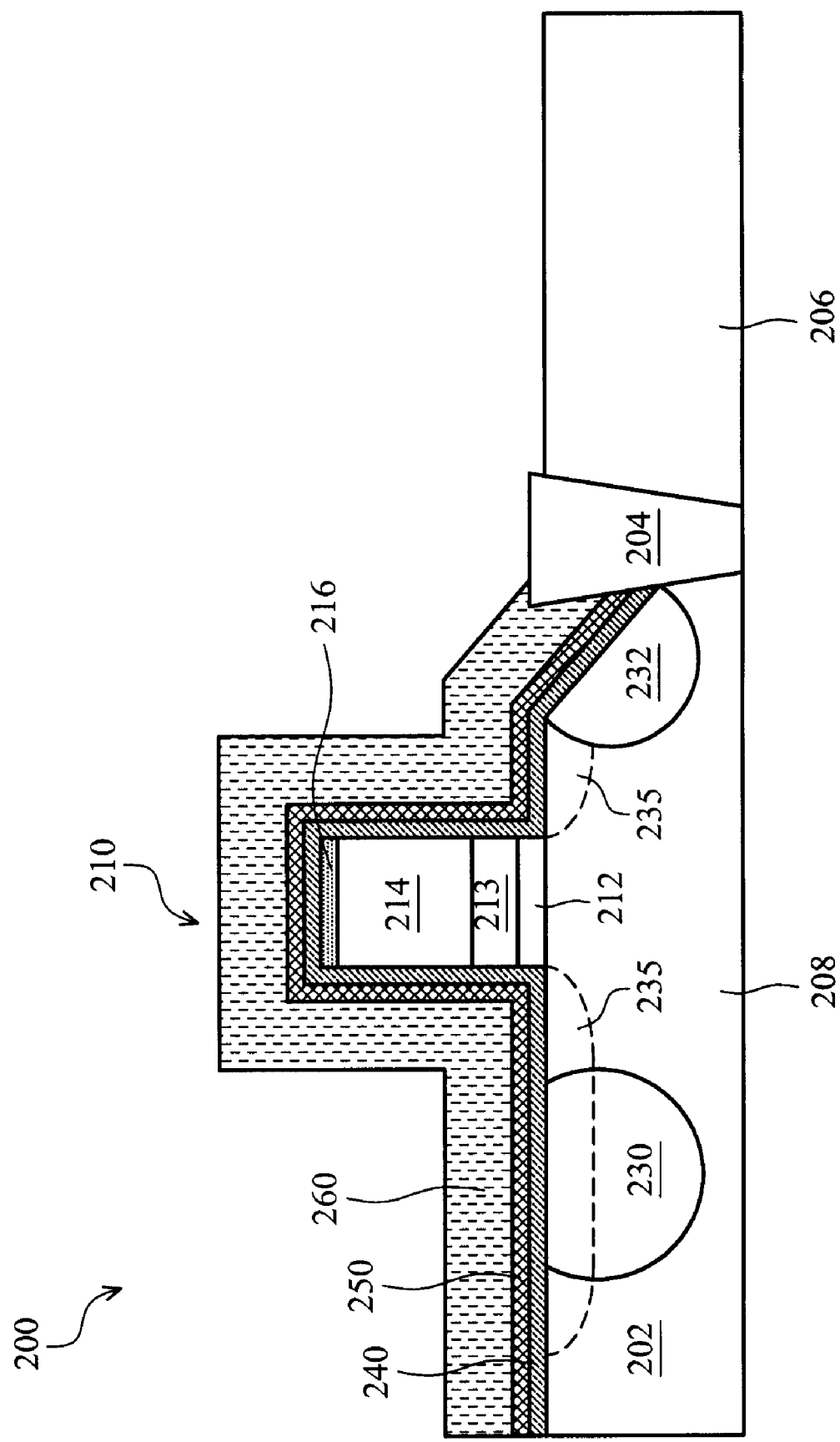

The method 100 continues with block 160 in which a second silicon oxide layer is formed over the silicon nitride spacer layer. Referring now to FIG. 2G, a spacer layer 260 may be formed over the spacer layer 250 by a technique known in the art, such as CVD or ALD. The spacer layer 260 may include an oxide material such as silicon oxide. The spacer layer 260 may include a thickness ranging from about 100 angstroms to about 1000 angstroms. It should be noted that the thickness of the spacer layer 260 may be greater than the thicknesses of the spacers layers 240 and 250, respectively. Accordingly, the thicker spacer layer 260 may make it easier to control and optimize a critical dimension of the sidewall/gate spacers in a subsequent etching process discussed below.

Figure 2H:
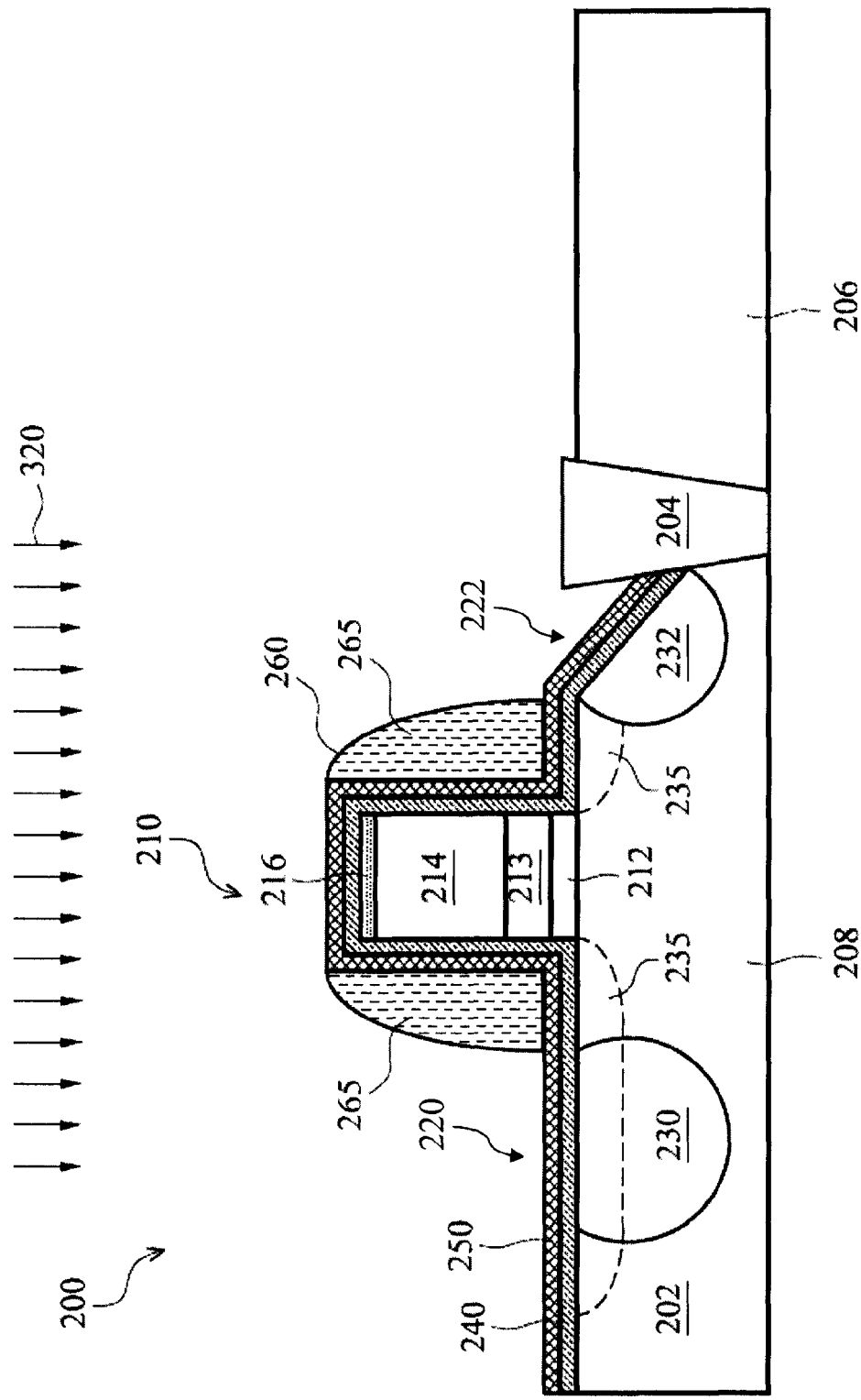

The method 100 continues with block 170 in which a first dry etching process is performed to remove a portion of the second silicon oxide layer. Referring now to FIG. 2H, an etching process 320 may be performed to the spacer layer 260. The etching process 320 may be a dry etching process and may include a carbon fluoric based plasma gas as an etchant. The etching process 320 may remove a portion of the spacer layer 260 above the gate stack 210. The etching process 320 may also remove a portion of the spacer layer 260 overlying the semiconductor material 230 and 232 in the recess regions 220 and 222, respectively. Hence, a remaining portion of the spacer layer 260 after the etching process 320 may form features 265 on the sidewalls of the gate stack 210. A thickness of the features 265 may be controlled by an etching rate of the etching process 320 and also a thickness of the spacer layer 260 initially deposited (in block 160). The features 265 may be used to protect portions of the underlying spacer layers 250 and 240 from being etched in later etching processes. The features 265 may also be used to prevent a bridging effect. Also, since the spacer layer 260 includes an oxide material and the spacer layer 250 includes a nitride material in the present embodiment, there may be sufficient etching selectivity between the spacer layers 250 and 260. Therefore, the spacer layer 250 may function as a stop layer for the etching process 320.

Figure 2I:
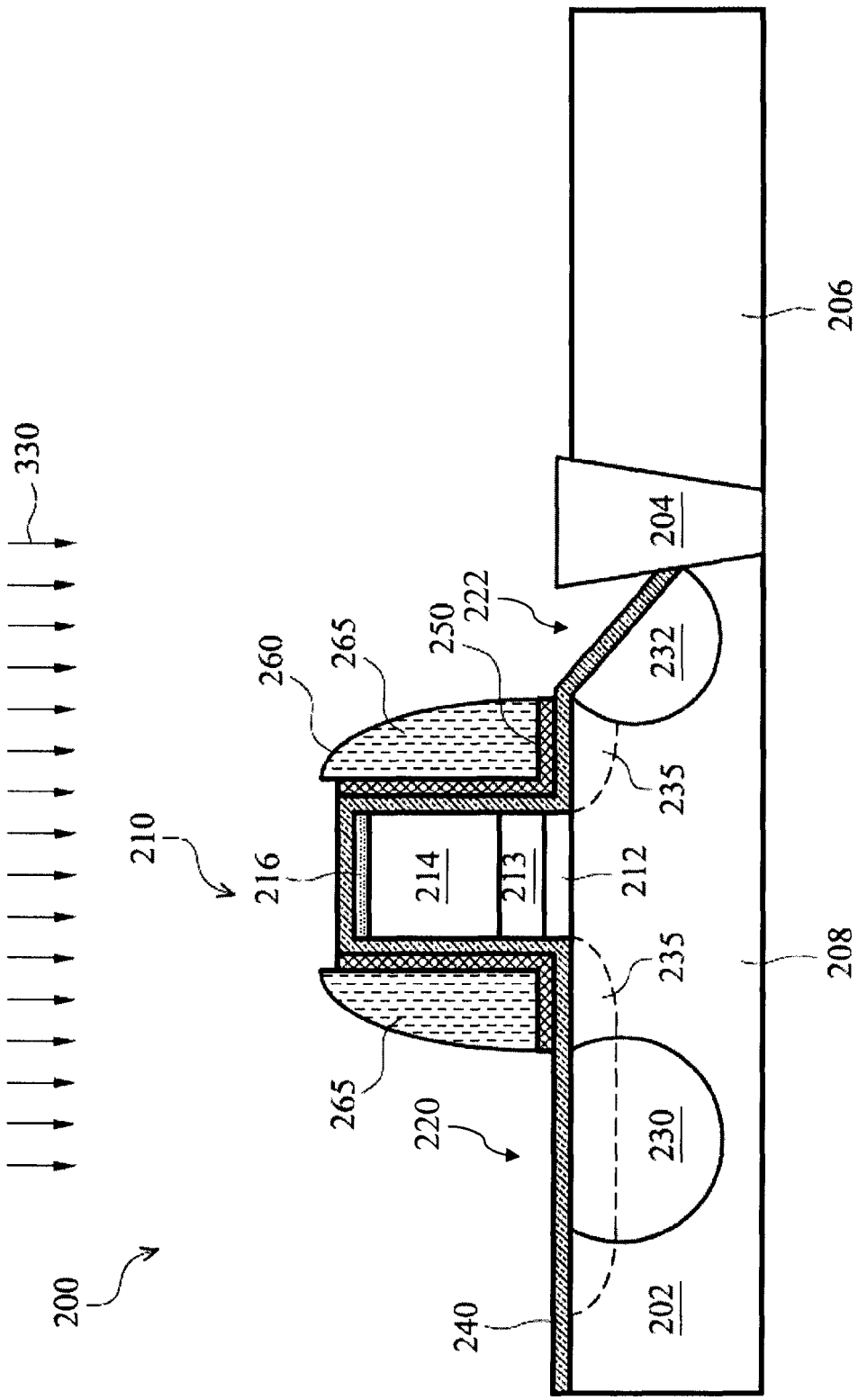

The method 100 continues with block 180 in which a second dry etching process is performed to remove a portion of the silicon nitride layer. Referring now to FIG. 2I, an etching process 330 may be performed to the spacer layer 250. The etching process 330 may be a dry etching process to etch away portions of the spacer layer 250 not protected by the features 265. Hence, the etching process 330 may remove a portion of the spacer layer 250 above the gate stack 210. The etching process 330 may also remove a portion of spacer layer 250 overlying the semiconductor material 230 and 232 in the recess regions 220 and 222. In the present embodiment, the etching process 330 may be a dry etching process and may include a carbon hydro-fluoric based plasma gas as an etchant. Also, since the spacer layer 240 includes an oxide material and the spacer layer 250 includes a nitride material in the present embodiment, there may be sufficient etching selectivity between the spacer layers 240 and 250. Thus, the spacer layer 240 may function as a stop layer for the etching process 330.

Figure 2J:
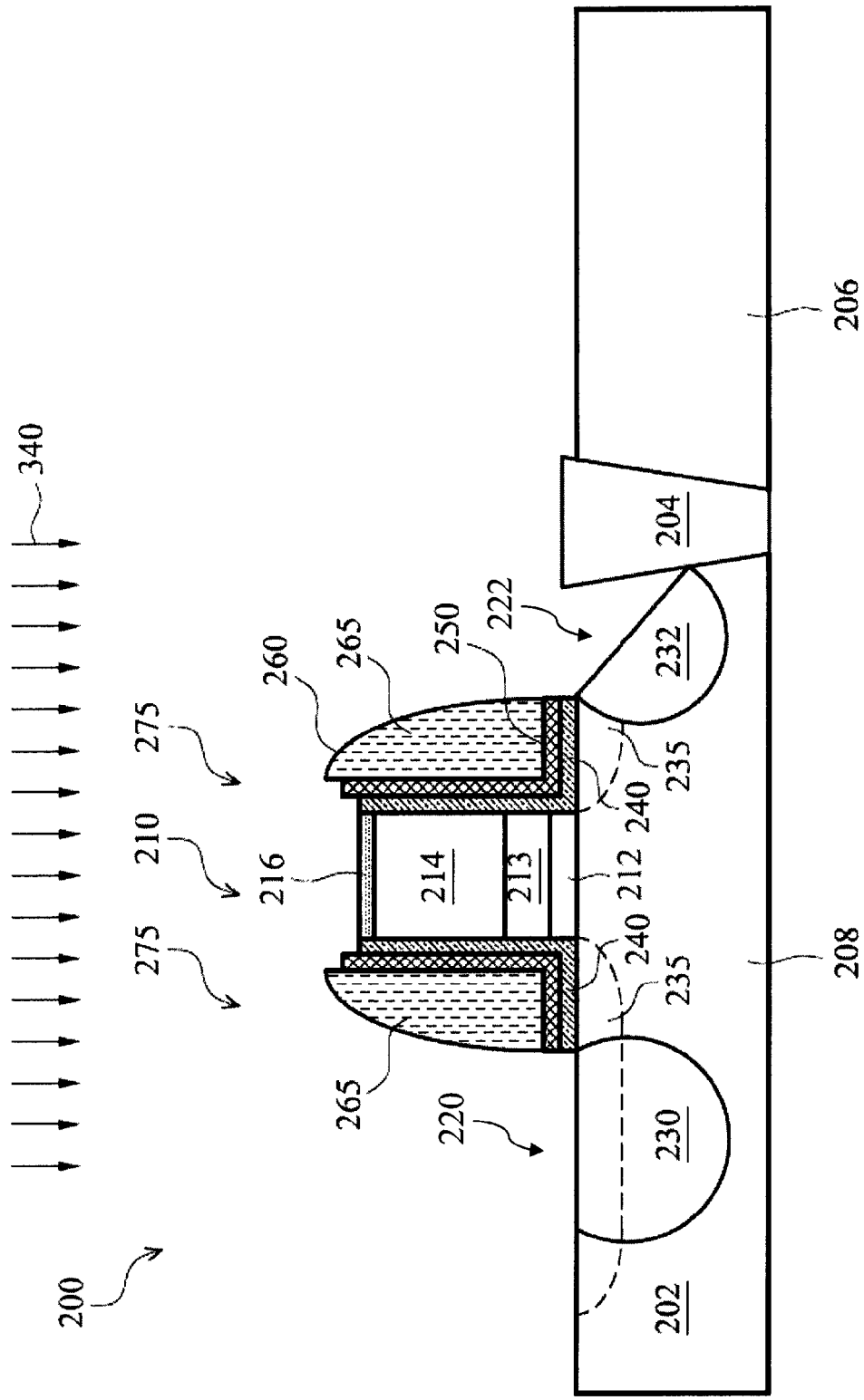

The method 100 continues with block 190 in which a third dry etching process is performed to remove a portion of the first silicon oxide layer thereby forming gate spacers on sidewalls of the gate stack. Referring now to FIG. 2J, an etching process 340 may be performed to the spacer layer 240. The etching process 340 may be a dry etching process using a plasma gas to etch away portions of the spacer layer 240 not protected by the features 265. Hence, the etching process 340 may remove a portion of the spacer layer 240 above the hard mask the gate stack 210. The etching process 330 may also remove a portion of spacer layer 240 over the semiconductor material 230 and 232 in the recess regions 220 and 222. In the present embodiment, the etching process 340 may be a dry etching process and may include a carbon fluoric based plasma gas as an etchant. The etching process 340 may substantially etch away the spacer layer 240 over the semiconductor material 232 in the recess region 222 so that there may be no residue over the semiconductor material 232 in the recess region 222. After the etching process 340 is performed, spacers 275 may be formed on the sidewalls of the gate stack 210. The spacers 275 may include a remaining portion of the spacer layer 250 sandwiched between the feature 265 and a remaining portion of the spacer layer 240.

It may be observed that if the sidewall spacers had been formed by forming a main spacer material over the substrate and the gate stack and performing a dry etching process to the spacer material, there may be a spacer residue issue. With traditional methods, forming a main spacer material over the substrate would fill in a portion of the recess region with the spacer material. The dry etching process performed to form the spacers and remove the spacer material in the recess region may not be effective, thus leaving a spacer material residue over the strained feature in the recess region. The material residue may adversely effect subsequent processing such as an ion implantation process to form source/drain regions and a salicidation process to form silicide features on the source/drain regions and other active regions. In comparison, the present embodiment may completely remove the various spacer layers on the semiconductor material 232 in the recess region 222 through several etching processes. Thus, an advantage of the present embodiment is an absence of undesired spacer material residue in the semiconductor device 202.

It is understood that the method 100 may continue with additional steps to complete the fabrication of the semiconductor device 200. For example, heavy doped source/drain regions may be formed in the substrate 202 on either side of the gate stack 210 using ion implantation or diffusion with suitable N-type or P-type dopants. The heavy doped source/drain regions may be substantially aligned with the outer sides of the features 265. Silicide features may be formed on the source/drain regions and the poly layer by a salicidation process. A contact etch stop layer (CESL) may be formed over the substrate. An interlayer dielectric (ILD) layer may be formed over the CESL. In addition, contacts and interconnects may also be formed to establish electrical connections for the semiconductor device 200.

In summary, the methods and devices disclosed herein take advantage of forming recess regions in a silicon substrate of a semiconductor device and filling the recess regions with a strained semiconductor material to create a strained interface between the substrate and the semiconductor material. Also disclosed are spacers having a multilayered configuration and formed by performing optimized dry etching processes. In doing so, the present embodiment offers several advantages over prior art devices. One advantage of the present embodiment is that the strained interface between the semiconductor material in the recess regions and the silicon substrate enhances a carrier mobility of the semiconductor device. The enhanced carrier mobility allows for a greater channel current without having to increase a gate voltage. Another advantage of the present embodiment is that the multilayered configuration of the spacers and the optimized etching processes overcome a spacer residue issue that may exist with prior technologies. One more advantage of the present embodiment is that the methods disclosed herein are compatible with a CMOS process flow and may be easily implemented. It is understood that different embodiments disclosed herein offer different advantages, and that no particular advantage is necessarily required for all embodiments.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, the embodiments disclosed herein may be implemented in a gate replacement process (or gate last process), or a hybrid process that includes a gate first process and gate last process.

What is claimed is:

1. A method of fabricating a semiconductor device, comprising:
   providing a silicon substrate having a shallow trench isolation (STI) formed thereon;
   forming a gate stack over the silicon substrate;
   forming dummy spacers on sidewalls of the gate stack;
   forming a recess region in the silicon substrate, wherein the recess region is interposed between the gate stack and the STI, and wherein the recess region is partially defined by a sidewall of the STI;
   epi-growing a semiconductor material in the recess region to partially fill the recess region, wherein the semiconductor material is different from the silicon substrate, and wherein no semiconductor material is formed on the sidewall of the STI;
   removing the dummy spacers;
   forming a first silicon oxide layer over the gate stack and the semiconductor material;
   forming a silicon nitride layer over the first silicon oxide layer;
   forming a second silicon oxide layer over the silicon nitride layer;
   performing a first dry etching process to remove a portion of the second silicon oxide layer;
   performing a second dry etching process to completely remove a portion of the silicon nitride layer disposed over the semiconductor material and unprotected by a remaining portion of the first oxide layer; and
   performing a third dry etching process to completely remove a portion of the first silicon oxide layer formed on the semiconductor material, thereby forming a gate spacer on a sidewall of the gate stack, wherein the gate spacer includes remaining portions of the first silicon oxide layer, the silicon nitride layer, and the second silicon oxide layer.

2. The method of claim 1, wherein the semiconductor material includes silicon germanium or silicon carbide.

3. The method of claim 1, wherein forming the recess region includes forming the recess region by an isotropic etching process.

4. The method of claim 3, wherein the isotropic etching process includes a dry etching process that utilizes a HBr plasma gas, and wherein the dry etching process includes tuning a bias power to define an isotropic profile of the recess region.

5. The method of claim 1, wherein the shallow trench isolation forms a boundary of the recess region.

6. The method of claim 1, wherein the first and third dry etching processes each utilizes a carbon fluoric plasma gas, and wherein the second dry etching process utilizes a carbon hydro-fluoric plasma gas.

7. The method of claim 1, wherein the forming the recess region is carried out in a manner so that the semiconductor material has a slanted surface that extends from one of the dummy spacers to the shallow trench isolation.

8. A method of fabricating a semiconductor device, comprising:
   forming a gate stack over a silicon substrate;
   forming dummy spacers on sidewalls of the gate stack;
   isotropically etching the silicon substrate to form recess regions on either side of the gate stack;
   forming a semiconductor material in the recess regions, wherein the semiconductor material is different from the silicon substrate, and wherein at least one of the recess regions is only partially filled by the semiconductor material, wherein the semiconductor material partially filling the at least one of the recess regions has a slanted surface, and wherein no semiconductor material is formed on a sidewall of a dielectric trench isolation device that partially defines the recess region;
   removing the dummy spacers;
   forming a plurality of spacer layers having an oxide-nitride-oxide configuration over the gate stack and the semiconductor material, the plurality of spacer layers including a nitride spacer layer disposed between an upper oxide spacer layer and a lower oxide spacer layer; and etching the spacer layers to form gate spacers on the sidewalls of the gate stack, wherein the etching the spacer layers includes:

etching the upper oxide spacer layer to form an oxide spacer, the oxide spacer protecting portions of the nitride spacer layer and the lower oxide spacer layer below;

etching the nitride spacer layer to completely remove an unprotected portion of the nitride spacer layer that is disposed over the partially-filled recess region; and etching the lower oxide spacer layer to completely remove an unprotected portion of the lower oxide spacer layer disposed over the partially-filled recess region.

9. The method of claim 8, wherein isotropically etching the silicon substrate includes performing a dry etching process using a hydro-boric plasma gas and tuning a bias power of the dry etching process to define an isotropic profile of the recess regions.

10. The method of claim 8, wherein forming the plurality of spacer layers includes:

forming a first oxide layer as the lower oxide spacer layer over the gate stack and the semiconductor material, wherein the first oxide layer includes a thickness ranging from about 30 to about 200 angstrom;

forming a nitride layer as the nitride spacer layer over the first oxide layer, wherein the silicon nitride layer includes a thickness ranging from about 30 to about 200 angstrom; and forming a second oxide layer as the upper oxide spacer layer over the nitride layer, wherein the second oxide layer includes a thickness ranging from about 100 to about 1000 angstrom.

11. The method of claim 10, wherein etching the spacer layers includes:

etching the second oxide layer with a first dry etching process using a carbon fluoric plasma gas;

etching the nitride layer with a second dry etching process using a carbon hydro-fluoric plasma gas; and etching the first oxide layer with a third dry etching process using a carbon fluoric plasma gas.

12. The method of claim 8, wherein the semiconductor material includes silicon germanium or silicon carbide, and further comprising forming lightly doped source/drain (LDD) regions on either side of the gate stack after removing the dummy spacers, wherein a portion of each LDD region is disposed in the semiconductor material and another portion of each LDD region is disposed in the silicon substrate.

13. The method of claim 8, wherein the slanted surface extends from the sidewall of the dielectric trench isolation to one of the dummy spacers.

14. The method of claim 8, wherein the dielectric trench isolation device is a shallow trench isolation device.

15. A method, comprising:

forming a gate over a substrate, the substrate including a first semiconductor material;

forming first and second openings in the substrate, the first and second openings being formed on opposite sides of the gate;

partially filling at least one of the first and second openings with a second semiconductor material that is different from the first semiconductor material, wherein the partially-filled opening is defined in part by a sidewall of a dielectric isolation device, and wherein no second semiconductor material is formed on the sidewall of the dielectric isolation device;

forming a first oxide layer over the substrate and the gate;

forming a nitride layer over the first oxide layer;

forming a second oxide layer over the nitride layer; and etching the second oxide layer to form an oxide spacer;

etching the nitride layer in a manner to expose a portion of the first oxide layer overlying the second semiconductor material that is in the partially-filled opening;

etching the first oxide layer to expose the second semiconductor material that is in the partially-filled opening;

wherein a gate spacer is thereafter formed by the oxide spacer and remaining portions of the nitride layer and the first oxide layer.

16. The method of claim 15, wherein the etching the second oxide layer, the etching the nitride layer, and the etching the first oxide layer are each performed using a dry etching process.

17. The method of claim 15, wherein the first and second semiconductor materials are selected in a manner so as to cause a strained interface between the first and second semiconductor materials.

18. The method of claim 15, wherein the dielectric isolation device is a shallow trench isolation.

19. The method of claim 15, wherein the second semiconductor material in the partially-filled opening has a tilted surface.

20. The method of claim 15, wherein the forming the first and second openings includes forming the first and second openings using an isotropic etching process.

* * * * *